(12) United States Patent
Harvey et al.

(10) Patent No.: US 8,440,917 B2
(45) Date of Patent: May 14, 2013

(54) METHOD AND APPARATUS TO REDUCE IMPEDANCE DISCONTINUITY IN PACKAGES

(75) Inventors: Paul M. Harvey, Austin, TX (US);
Douglas O. Powell, Endicott, NY (US);
Wolfgang Sauter, Richmond, VT (US);
Yaping Zhou, Austin, TX (US)

(73) Assignee: International Business Machines Corporation, Armonk, NY (US)

( * ) Notice: Subject to any disclaimer, the term of this patent is extended or adjusted under 35 U.S.C. 154(b) by 822 days.

(21) Appl. No.: 11/942,061

(22) Filed: Nov. 19, 2007

(65) Prior Publication Data
US 2009/0126983 A1 May 21, 2009

(51) Int. Cl.
*H05K 1/11* (2006.01)
(52) U.S. Cl.
USPC .......................... 174/264; 174/262; 174/266
(58) Field of Classification Search ............. 174/264, 174/266
See application file for complete search history.

(56) References Cited

U.S. PATENT DOCUMENTS

| 4,131,516 | A * | 12/1978 | Bakos et al. ............... 29/832 |
| 5,309,632 | A * | 5/1994 | Takahashi et al. ......... 29/852 |
| 5,587,885 | A * | 12/1996 | Swamy ...................... 361/777 |
| 6,498,381 | B2 * | 12/2002 | Halahan et al. ........... 257/449 |
| 2002/0005295 | A1 * | 1/2002 | Mizutani et al. .......... 174/262 |
| 2002/0007966 | A1 * | 1/2002 | Miller et al. .............. 174/262 |
| 2004/0160721 | A1 * | 8/2004 | Barr et al. ................. 361/104 |
| 2005/0064707 | A1 * | 3/2005 | Sinha ....................... 438/667 |
| 2005/0126818 | A1 * | 6/2005 | Kojima et al. ............ 174/255 |
| 2006/0180941 | A1 * | 8/2006 | Kirby et al. .............. 257/774 |
| 2007/0194432 | A1 * | 8/2007 | Hsu et al. ................. 257/698 |

OTHER PUBLICATIONS

Magnetic materials chart.*

* cited by examiner

*Primary Examiner* — Tuan T Dinh
*Assistant Examiner* — Steven Sawyer
(74) *Attorney, Agent, or Firm* — Yudell Isidore Ng Russell PLLC

(57) ABSTRACT

A method, system and apparatus for coating plated through holes (PTHs) to reduce impedance discontinuity in electronic packages. PTH vias are imbedded in the core of a printed circuit board comprising a core layer, a plurality of buildup layers, a plurality of micro-vias, and a plurality of traces. Traces electrically interconnect each of the micro-vias to PTH vias, forming an electrically conductive path. PTHs are coated with a magnetic metal material, such as nickel, to increase the internal and external conductance of the PTHs, thereby providing decreased impedance discontinuity of the signals in electronic packages.

13 Claims, 4 Drawing Sheets

METHOD AND APPARATUS TO REDUCE IMPEDANCE DISCONTINUITY IN PACKAGES

BACKGROUND

1. Technical Field

The present invention generally relates to electronic circuits and in particular to reducing impedance discontinuity in the packaging of electronic circuits.

2. Description of the Related Art

Electronic products, including computers, cellular telephones, and networking systems operate at ever increasing high transmission rates. When operating at high transmission rates, impedance discontinuity decreases the quality of signals in the electronic packages of these devices. Also, excessive capacitance of plated through holes (PTHs) and ball grid arrays (BGAs) can significantly degrade the quality of signals propagating through interconnects of an electronic package.

Numerous techniques have been utilized to improve signal degradation in electronic packaging. For example, an intricate via pattern design, forming an extended, electrically conductive path, has been provided in an effort to decrease impedance discontinuity by increasing the length of the inductive trace. Dramatically increasing the inductive trace increases the length the signal travels; thereby increasing opportunities for signal interference. In addition to increased signal length, the intricate detail of the trace pattern may be impractical to integrate into a currently running process.

In an effort to decrease impedance discontinuities, metal plane layers above the BGA pads on the printed circuit board (PCB) of the electronic packages have been removed. Removing the planar conductive layers above the BGA pads reduces capacitance; however, removing the planes also deteriorates the plane integrity of the printed circuit board of which the electric package is built. In addition to jeopardizing the plane integrity, the routes in which the signals may travel are drastically decreased and the mechanical strength of the PCB is diminished.

SUMMARY OF ILLUSTRATIVE EMBODIMENTS

Disclosed are a method, system and apparatus for coating plated through holes (PTHS) to reduce impedance discontinuity in electronic packages. PTHs are coated with a magnetic metal material, such as nickel, to increase the internal and external inductance of the PTHs, thereby providing decreased impedance discontinuity of the signals in electronic packages. PTH vias are imbedded in the core of a printed circuit board comprising a core layer, a plurality of buildup layers, a plurality of micro-vias, and a plurality of traces. Traces electrically interconnect each of the micro-vias to PTH vias, forming an electrically conductive path.

In one embodiment PTH vias are fabricated with magnetic metal coatings to reduce distortion of high speed signals. Electronic packages output high speed signals that are compromised due to excess capacitance in PTHs. During fabrication of PTH vias, holes are drilled into the core dielectric material of the printed circuit board. Then, a magnetic metal coating is added to the walls of PTHs to reduce the impedance discontinuity of the electronic package. Deposition of a metal material, such as nickel, is followed by coating the metal material with copper. After coating the walls of the PTH via, resin may be deposited into the via.

In one embodiment, impedance discontinuity is reduced by utilizing a PTH via connected to the trace of a printed circuit board. The PTH via, coated with the magnetic metal coating, is connected to the trace from the copper layer of the PTH via. The magnetic coating material increases internal and external inductance in the electronic package by changing the magnetic environment. PTH vias with only a copper layer contain excess capacitance. Increasing the inductance of the PTH via utilizing the magnetic layer compensates for the excess capacitance without compromising the structure of the printed circuit board.

In another embodiment, impedance discontinuity is further reduced by utilizing one or more PTH vias that are not connected to the trace of a printed circuit board. A magnetic metal layer is deposited on the PTH vias, followed by the copper coating and resin deposition. However, one or more PTH vias are imbedded in the dielectric core of the printed circuit board without connecting to a trace. Additional PTH vias with metal coatings and no trace connection further increases inductance; thereby, reducing impedance discontinuity.

The above as well as additional objectives, features, and advantages of the present invention will become apparent in the following detailed written description.

BRIEF DESCRIPTION OF THE DRAWINGS

The invention itself, as well as a preferred mode of use, further objects, and advantages thereof, will best be understood by reference to the following detailed description of an illustrative embodiment when read in conjunction with the accompanying drawings, wherein.

DETAILED DESCRIPTION OF AN ILLUSTRATIVE EMBODIMENT

Figure 1:
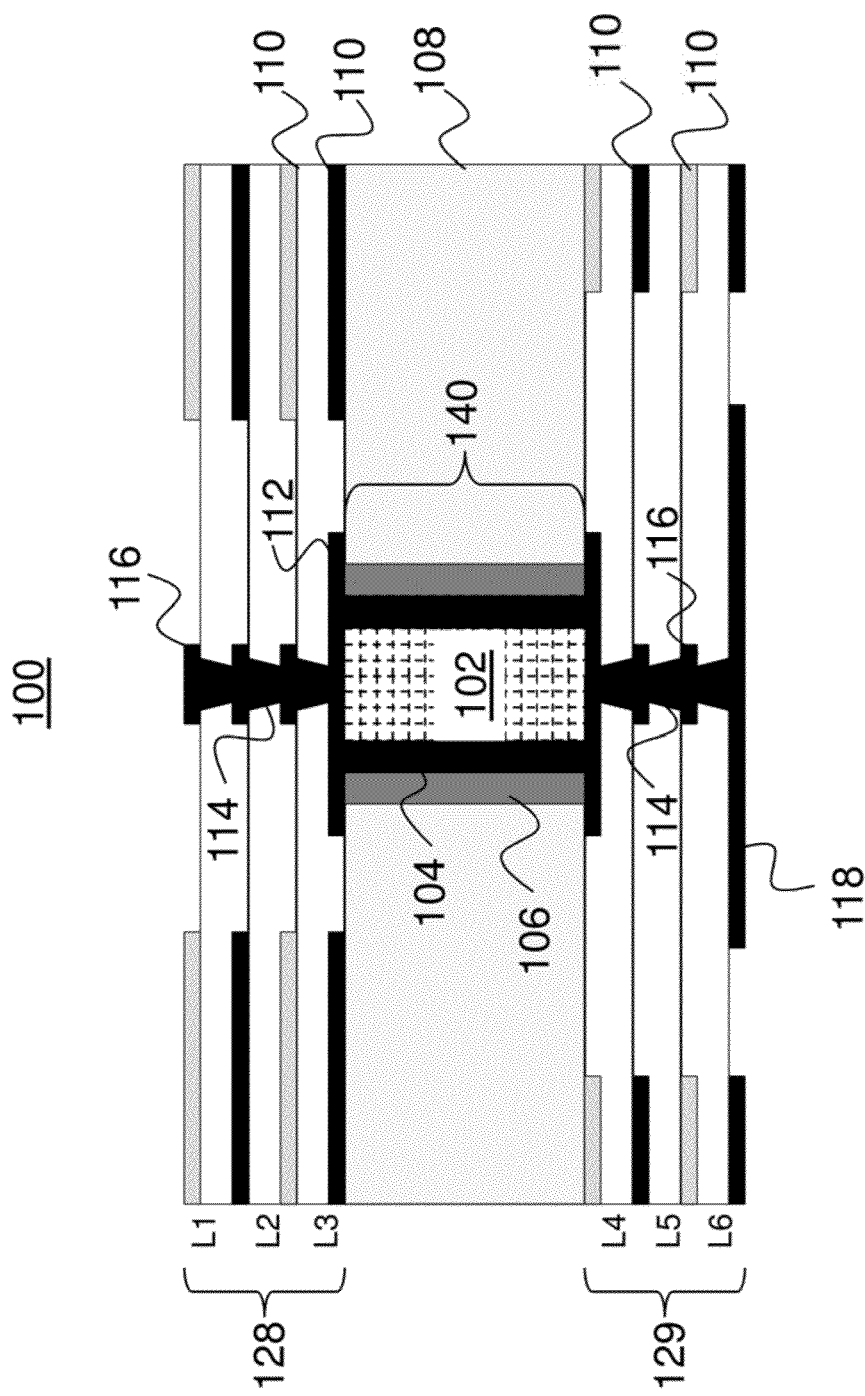
FIG. 1 is a cross-sectional view of a printed circuit board with a plated through hole coated with a magnetic material according to one embodiment of the invention.

Disclosed are a method, system and apparatus for coating plated through holes (PTHS) to reduce impedance discontinuity in electronic packages. PTHs are coated with a magnetic metal material, such as nickel, to increase the internal and external inductance of the PTHs, thereby providing decreased impedance discontinuity of the signals in electronic packages. PTH vias are imbedded in the core of a printed circuit board comprising a core layer, a plurality of buildup layers, a plurality of micro-vias, and a plurality of traces. Traces electrically interconnect each of the micro-vias to PTH vias, forming an electrically conductive path.

In the following detailed description of exemplary embodiments of the invention, specific exemplary embodiments in which the invention may be practiced are described in sufficient detail to enable those skilled in the art to practice the invention, and it is to be understood that other embodiments may be utilized and that logical, architectural, programmatic, mechanical, electrical and other changes may be made without departing from the spirit or scope of the present invention. The following detailed description is, therefore, not to be taken in a limiting sense, and the scope of the present invention is defined only by the appended claims.

Within the descriptions of the figures, similar elements are provided similar names and reference numerals as those of the previous figure(s). Where a later figure utilizes the element in a different context or with different functionality, the element is provided a different leading numeral representative of the figure number (e.g., 1xx for FIG. 1 and 2xx for FIG. 2). The specific numerals assigned to the elements are provided solely to aid in the description and not meant to imply any limitations (structural or functional) on the invention.

It is understood that the use of specific component, device and/or parameter names are for example only and not meant to imply any limitations on the invention. The invention may thus be implemented with different nomenclature/terminology utilized to describe the components/devices/parameters herein, without limitation. Each term utilized herein is to be given its broadest interpretation given the context in which that terms is utilized.

With reference now to the figures, and in particular FIG. 1, there is depicted a cross-sectional view of a printed circuit board with a plated through hole modified with a magnetic metal coating. Multiple layer (multi-layer) printed circuit board (PCB) 100 of FIG. 1 comprises the primary functional components found in an electrical package for transmitting high speed signals. Interconnected PTH via 140 is created within core dielectric 108 disposed (i.e., positioned) between upper planar conductive layer 128 (L1, L2, L3) and lower planar conductive layer 129 (L4, L5, L6), which layers may run in a substantially parallel direction relative to each other. Lower planar conductive layer 129 also comprises ball grid array (BGA) 118. Functional pads 110 are arranged on upper planar conductive layer 128 and lower planar conductive layer 129. Functional pads 110 are electrically connected to a conductive pattern (i.e. a signal trace, a ground or voltage, or a passive device, etc.).

Positioned between each build up layer are trace vias 114 and trace pads 116. Trace vias 114 and trace pads 116 are connected with interconnected PTH via 140 through via trace pad 112. Via trace pad 112 connects to copper layer 104, which is between magnetic metal layer 106. Magnetic metal layer 106 and copper layer 104 enclose resin 102.

In one embodiment, interconnected PTH via 140, surrounded by magnetic metal layer 106 decreases impedance discontinuity by increasing inductance. Magnetic metal layer 106 modifies the internal and external magnetic environment of multi-layer PCB 100 by increasing the internal and external inductance of interconnected PTH via 140.

In one embodiment, interconnected PTH via 140 forms an electrically conductive path with trace vias 114 and trace pads 116 through via trace pad 112. Trace vias 114 and trace pads 112 are arranged within each separate upper planar layers 128 and lower planar layers 129 forming a stable structure for controlling the impedance of interconnected PTH via 140. Preserving all layers of upper planar layers 128 and lower planar layers 129 avoids deterioration of plane integrity, maintains trace length for signal routing, and retains mechanical strength of multi-layer PCB 100.

Figure 2:
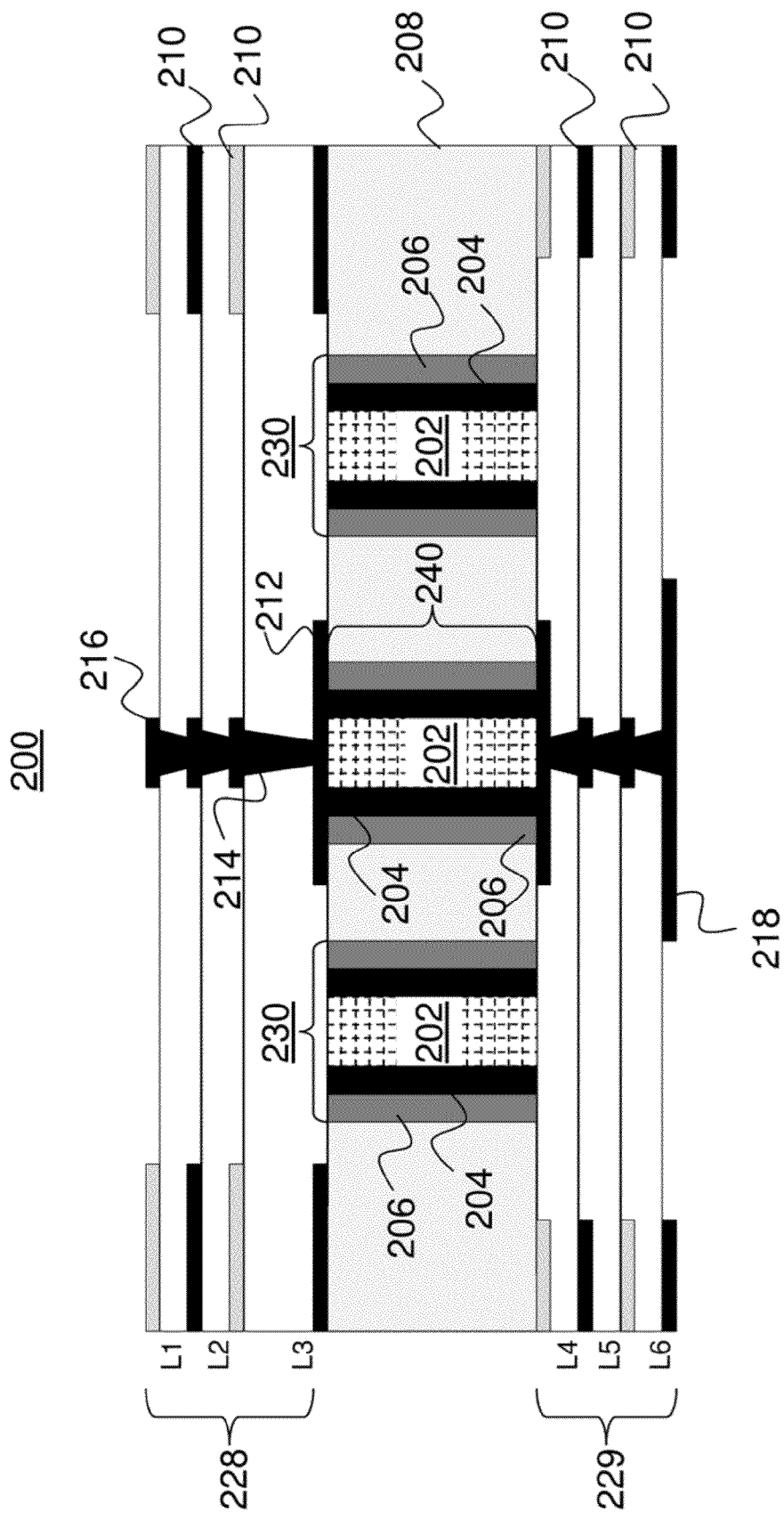
FIG. 2 is a cross-sectional view of a printed circuit board with a plurality of plated through holes coated with a magnetic material, in accordance with one embodiment of the invention.

With reference now to FIG. 2, that is a cross-sectional view of a printed circuit board with a plurality of plated through holes that are modified with a magnetic metal coating. Similar to FIG. 1, FIG. 2 comprises multi-layer PCB 200. Multi-layer PCB 200 is also composed of the primary functional components found in an electrical package for transmitting high speed signals. Interconnected PTH via 240 is created within core dielectric 208, which is disposed (positioned) between upper planar conductive layer 228 (L1, L2, L3) and lower planar conductive layer 229 (L4, L5, L6). Lower planar conductive layer 229 also comprises ball grid array (BGA) 218.

Functional pads 210 are arranged on upper planar conductive layer 228 and lower planar conductive layer 229. Functional pads 210 are electrically connected to a conductive pattern (i.e. a signal trace, a ground or voltage, or a passive device, etc.).

Positioned between each build up layer (L1, L2, L3, L4, L5, and L6) of upper planar conductive layers 228 and lower planar conductive layers 229 are trace vias 214 and trace pads 216. Trace vias 214 and trace pads 216 are connected with interconnected PTH 240 through via trace pad 212. Via trace pad 212 connects to copper layer 204 which is inside of magnetic metal layer 206. Magnetic metal layer 206 and copper layer 204 enclose resin 202. Non-connected PTH vias 230 are also coated with magnetic metal layer 206 and copper layer 204. Magnetic metal layer 206 and copper layer 204, of non-connected PTH vias 230, enclose resin 202.

In one embodiment, impedance discontinuity of a high speed signal within multi-layer PCB 200 is further improved by imbedding non-connected PTH vias 230 within PCB 200. Magnetic metal coating 206 of non-connected PTH vias 230 increase external conductance, compensating for excess capacitance within PTH vias 230, without forming redundant electrically conductive paths. The increased magnetic metal contributed by non-connected PTH vias 230 modifies the magnetic environment of multi-layer PCB 200 and does not add additional trace length or jeopardize the structure of multi-layer PCB 200.

Figure 3:
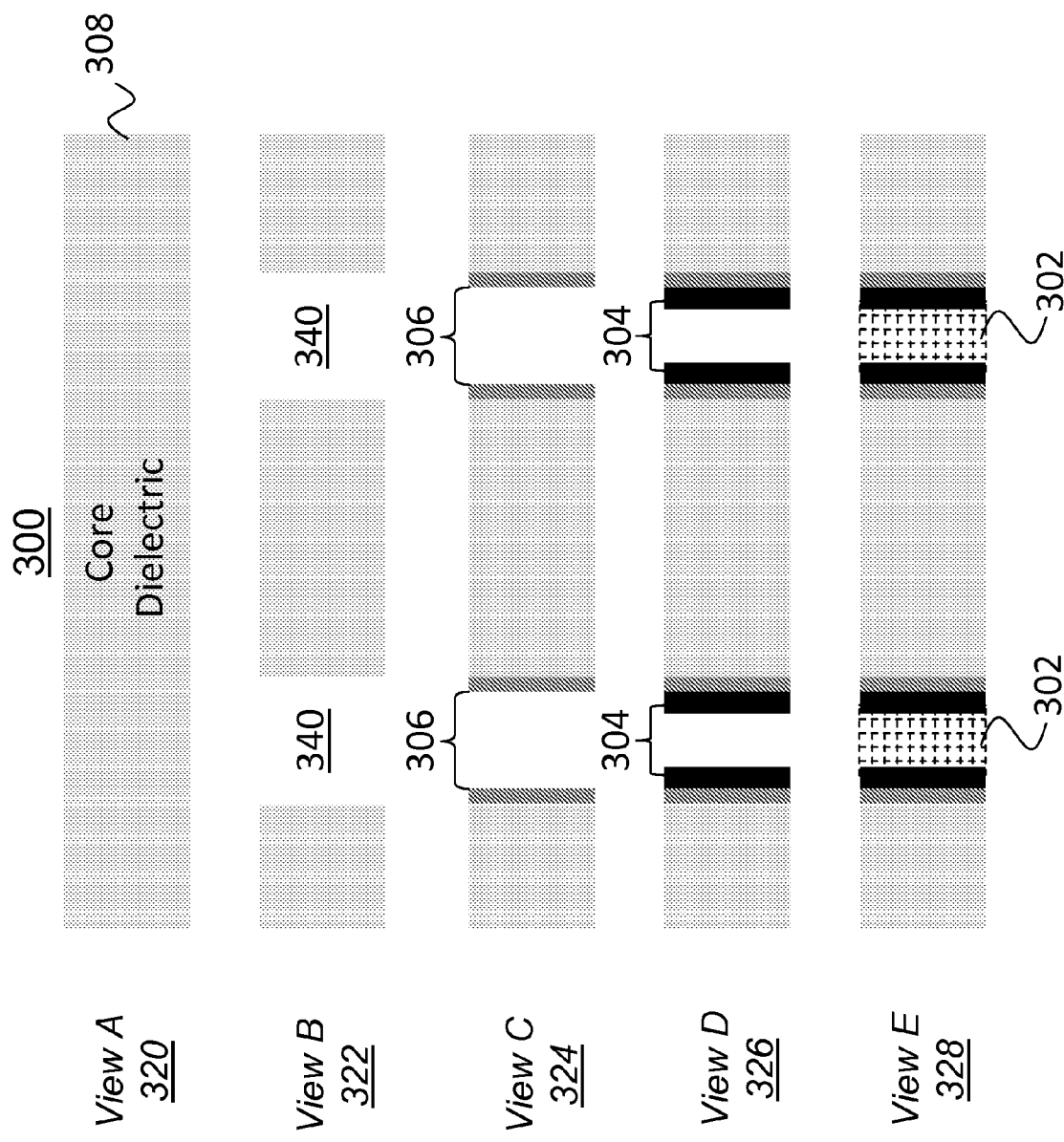
FIG. 3 is a schematic diagram of the process flow of creating plated through holes with a magnetic layer according to one embodiment of the invention.

FIG. 3 is a schematic diagram of the process flow of creating PTHs with a magnetic metal coating for use as PTH vias in a PCB. Schematic 300 comprises five views: View A 320, View B 322, View C 324, View D 326, and View E 328. The process flow begins at View A 320 with core dielectric 308, which is the base material utilized for fabricating PCB 200 having one or more PTHs 340. In View B 322, PTHs 340 are drilled to a certain diameter, for example approximately 120 micrometers. Then, in view C 324, the walls of PTH 340 are coated with magnetic metal layer 306. One or more microns of magnetic metal layer 306 may be deposited on the walls of PTHs 340. Multiple methods may be utilized to deposit magnetic metal layer 306 on the walls of PTHs 340, for example: plasma enhanced chemical vapor deposition, sputtering, dipping, and spin-on may be utilized for the metallization step. After coating the walls of PTHs 340 with magnetic metal layer 306, copper layer 308 is deposited over magnetic metal layer 306, in view D 326. Resin 302 is deposited into PTH 340 in view E 328.

In one embodiment, magnetic metal layer 306 may be nickel. The nickel layer is deposited on the walls of the dielectric. If necessary, an adhesion promoter is utilized to insure adhesion of the nickel to the walls of the dielectric material. The thickness of magnetic metal layer 306 deposited on the walls of the dielectric material in view C 324 is greater than the skin depth, thereby increasing the effectiveness of magnetic coating.

Figure 4:
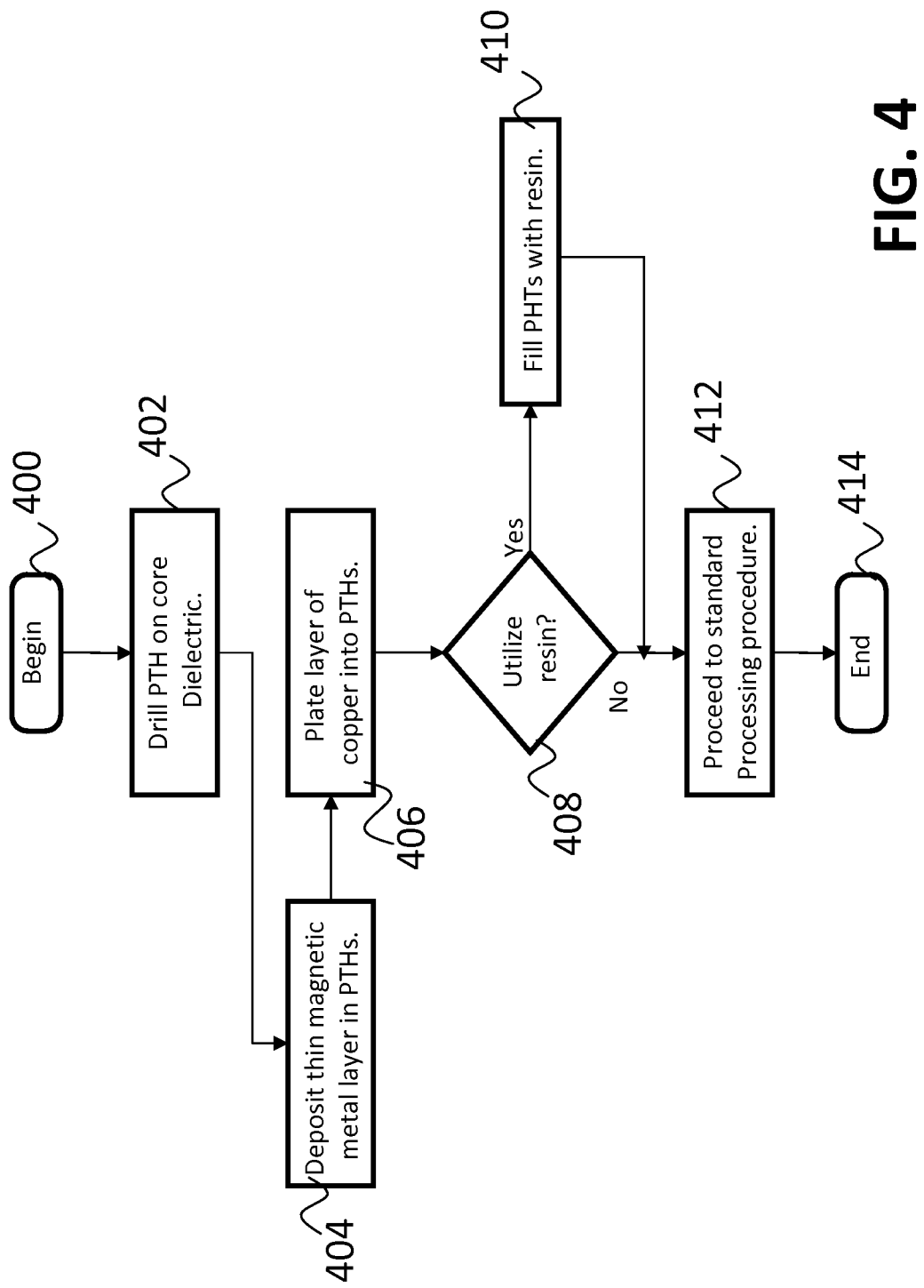
FIG. 4 is an illustration of a PTH via coated with a magnetic layer according to one embodiment of the invention.

FIG. 4 is a flow chart illustrating a method by which the above processes of the illustrative embodiments are completed. Although the methods illustrated in FIG. 4 may be described with reference to components shown in FIGS. 1-3, it should be understood that this is merely for convenience and alternative components and/or configurations thereof can be employed when implementing the various methods.

The process of FIG. 4 begins at initiator block 400. At block 400 a dielectric material is prepared for drilling PTHs. PTHs are drilled through the core dielectric material, at step 402. The core dielectric material is between two or more planar conductive layers. At step 404, a thin magnetic metal layer, such as nickel, is plated on the walls of the drilled PTHs.

Following deposition of the magnetic metal layer, at step 406, a copper layer is deposited onto the layer of magnetic metal layer.

A determination is made at step 408, as to whether to fill the PTHs with resin. If resin is to be utilized, the PTHs are filled with resin at step 410, then the process continues to step 412. If resin is not utilized the process proceeds to step 412. At step 412, the conventional process for completing the electronic package is completed. The process ends at step 414.

In the flow chart above, in some implementations, certain steps of the methods are combined, performed simultaneously or in a different order, or perhaps omitted, without deviating from the spirit and scope of the invention. Thus, while the method steps are described and illustrated in a particular sequence, use of a specific sequence of steps is not meant to imply any limitations on the invention. Changes may be made with regards to the sequence of steps without departing from the spirit or scope of the present invention. Use of a particular sequence is therefore, not to be taken in a limiting sense, and the scope of the present invention is defined only by the appended claims.

While the invention has been described with reference to exemplary embodiments, it will be understood by those skilled in the art that various changes may be made and equivalents may be substituted for elements thereof without departing from the scope of the invention. In addition, many modifications may be made to adapt a particular system, device or component thereof to the teachings of the invention without departing from the essential scope thereof. Therefore, it is intended that the invention not be limited to the particular embodiments disclosed for carrying out this invention, but that the invention will include all embodiments falling within the scope of the appended claims. Moreover, the use of the terms first, second, etc. do not denote any order or importance, but rather the terms first, second, etc. are used to distinguish one element from another.

What is claimed is:

1. A method of making an electrical package having decreased impedance discontinuity of propagating signals, the method comprising:

creating one or more plated through holes (PTHs) within a core dielectric layer of the electrical package, the PTHs having a dielectric internal;

coating an inner surface of the dielectric internal wall of the one or more PTHs with a layer of a magnetic material, wherein an interior surface area of the one or more PTHs is coated with the layer of the magnetic material, and wherein the magnetic material modifies the internal and external magnetic environment of the core dielectric by decreasing impedance discontinuity of signals and increasing an inductance of the one or more PTHs;

plating an electrically conductive metal layer on top of the layer of the magnetic material;

depositing a resin inside the electrically conductive metal layer and filling an internal cavity of the one or more PTHs within the electrically conductive metal layer with the resin;

disposing the core dielectric between a first planar conductive layer and a second planar conductive layer in a planar direction that is substantially perpendicular to the one or more PTHs; and embedding a plurality of traces within the first planar conductive layer and the second planar conductive layer to form electrically conductive paths to the one or more PTHs, wherein said embedding the plurality of traces includes:

embedding one or more vias and one or more trace pads disposed between each of the one or more first planar conductive layers and serially connected to each other and to the primary trace pad of the first conductive layer, which enable an electrical conductive path from the electrically conductive metal layer of the one or more PTH through the first planar conductive layers; and embedding one or more vias and one or more trace pads disposed between each of the one or more second planar conductive layers and serially connected to each other and to the primary trace pad of the second conductive layer, which enable an electrical conductive path from the electrically conductive metal layer of the one or more PTH through the second planar conductive layers.

2. The method of claim 1, wherein the conductive metal layer is copper.

3. The method of claim 1, said creating further comprising:

placing an adhesion promoter on an interior surface area of dielectric walls of the one or more PTHs; and depositing the magnetic material over the adhesion promoter on the dielectric walls of the one or more PTHs.

4. The method of claim 1, the coating the inner surface of the dielectric internal wall of the one or more PTHs magnetic material further comprising:

depositing the magnetic material at a thickness that is greater than a skin depth.

5. The method of claim 1, wherein the magnetic material is nickel.

6. The method of claim 1, wherein the conductive metal layer is a copper layer coated on the top of the magnetic metal layer.

7. The method of claim 1, further comprising:

providing a first and a second primary trace pad disposed within a first conductive layer of the first and the second planar conductive layers, respectively, and connecting a first end and a second end of the first and the second planar conductive layers to respective ends of the electrically conductive metal layer of the one or more PTH.

8. The method of claim 1, further comprising:

embedding one or more functional pads within the first planar conductive layer, the functional pads being electrically connected to a conductive pattern; and providing a ball grid array within the second planar conductive layer.

9. The method of claim 1, wherein the PTH vias are not electrically connected to a trace mechanism and provide increased inductance of the electrical package.

10. The method of claim 1, wherein the inner surface of the dielectric internal wall of the one or more PTHs with a magnetic material is coated using plasma enhanced chemical vapor deposition.

11. The method of claim 1, wherein the inner surface of the dielectric internal wall of the one or more PTHs with a magnetic material is coated using a sputtering method.

12. The method of claim 1, wherein the inner surface of the dielectric internal wall of the one or more PTHs with a magnetic material is coated using a dipping method.

13. The method of claim 1, wherein the inner surface of the dielectric internal wall of the one or more PTHs with a magnetic material is coated using a spin-on method.

* * * * *